United States Patent
Wang et al.

(10) Patent No.: US 9,053,818 B2
(45) Date of Patent: Jun. 9, 2015

(54) MODE CHANGING CIRCUITRY

(71) Applicant: TAIWAN SEMICONDUCTOR MANUFACTURING COMPANY, LTD., Hsinchu (TW)

(72) Inventors: Bing Wang, Palo Alto, CA (US); Kuoyuan (Peter) Hsu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/549,043

(22) Filed: Nov. 20, 2014

(65) Prior Publication Data

US 2015/0078105 A1   Mar. 19, 2015

Related U.S. Application Data

(63) Continuation of application No. 13/099,809, filed on May 3, 2011.

(60) Provisional application No. 61/418,021, filed on Nov. 30, 2010.

(51) Int. Cl.
G11C 7/00 (2006.01)
G11C 11/417 (2006.01)

(52) U.S. Cl.
CPC .................................. *G11C 11/417* (2013.01)

(58) Field of Classification Search
CPC ................... G11C 11/5628; G11C 2211/5634; G11C 16/12
USPC .................. 365/189.11, 189.08, 63
See application file for complete search history.

(56) References Cited

U.S. PATENT DOCUMENTS

| | | | |
|---|---|---|---|
| 5,798,970 A * | 8/1998 | Ong | 365/189.05 |
| 6,081,460 A | 6/2000 | Lim et al. | |
| 6,097,179 A | 8/2000 | Ray et al. | |
| 6,181,602 B1 * | 1/2001 | Campardo et al. | 365/185.21 |
| 6,424,587 B1 | 7/2002 | Hosoda | |
| 6,549,042 B2 * | 4/2003 | Proebsting | 365/205 |
| 6,956,779 B2 * | 10/2005 | Tran | 365/205 |
| 2006/0197581 A1 | 9/2006 | Chun et al. | |

FOREIGN PATENT DOCUMENTS

| | | |
|---|---|---|
| CN | 101295538 | 10/2008 |
| TW | 200517800 | 6/2005 |

OTHER PUBLICATIONS

Office Action dated Oct. 27, 2014 from corresponding application No. TW 100137652.

* cited by examiner

*Primary Examiner* — Tuan T Nguyen
(74) *Attorney, Agent, or Firm* — Lowe Hauptman & Ham, LLP

(57) ABSTRACT

A circuit includes a PMOS transistor, an NMOS transistor, and a logic level generation section comprising an input and a logic level output. The PMOS gate receives an input voltage having a voltage level determined based on an operational voltage, the PMOS drain is coupled to the NMOS drain and the input of the logic level generation section, and the PMOS source is coupled to the operational voltage. The NMOS gate receives a voltage that causes the NMOS transistor to have a first driving capability. The first driving capability of the NMOS transistor is less than that of the PMOS transistor if the input voltage has a voltage level greater than a predetermined voltage level.

20 Claims, 4 Drawing Sheets

MODE CHANGING CIRCUITRY

PRIORITY CLAIM

The present application is a continuation of U.S. application Ser. No. 13/099,809, filed May 3, 2011, which claims the priority of U.S. Provisional Application No. 61/418,021, filed Nov. 30, 2010, the disclosures of which are incorporated herein by reference in their entireties.

FIELD

The present disclosure is related to a mode changing circuit.

BACKGROUND

Because of variations in manufacturing process, both P-type and N-type Metal Oxide Silicon transistors (PMOS and NMOS transistors) in different wafers have different driving capabilities or different operation currents from the drain to the source (e.g., different currents IDSsat). A transistor is said to be "fast" ("F") when the transistor while in operation has a high conduction capability and its current IDSsat is relatively high compared to a normal current IDSsat in a normal or average transistor ("T"). In contrast, the transistor is "slow" ("S") when the transistor has a low conduction capability and current IDSsat of the transistor is relative low compared to a current IDSsat in a normal transistor. When a transistor is fast, the threshold voltage, e.g., voltage VT, of that transistor, is lower, and the transistor is turned on easier with a lower voltage applied at its gate. The symbols TT, FF, FS, SF, SS refer to a pair of an NMOS transistor and a PMOS transistor being normal normal, fast fast, fast slow, slow fast or slow slow, respectively.

Generally, standby and leakage current in Random Access Memories (SRAMs) vary depending on the driving capabilities of the transistors used in the SRAMs. In an approach related to SRAMs, an NMOS transistor formed as a diode and functioned as a footer is used to reduce the standby current caused by the leakage current. This approach, however, also increases the minimum operational voltage of the memory cell in the standby mode.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
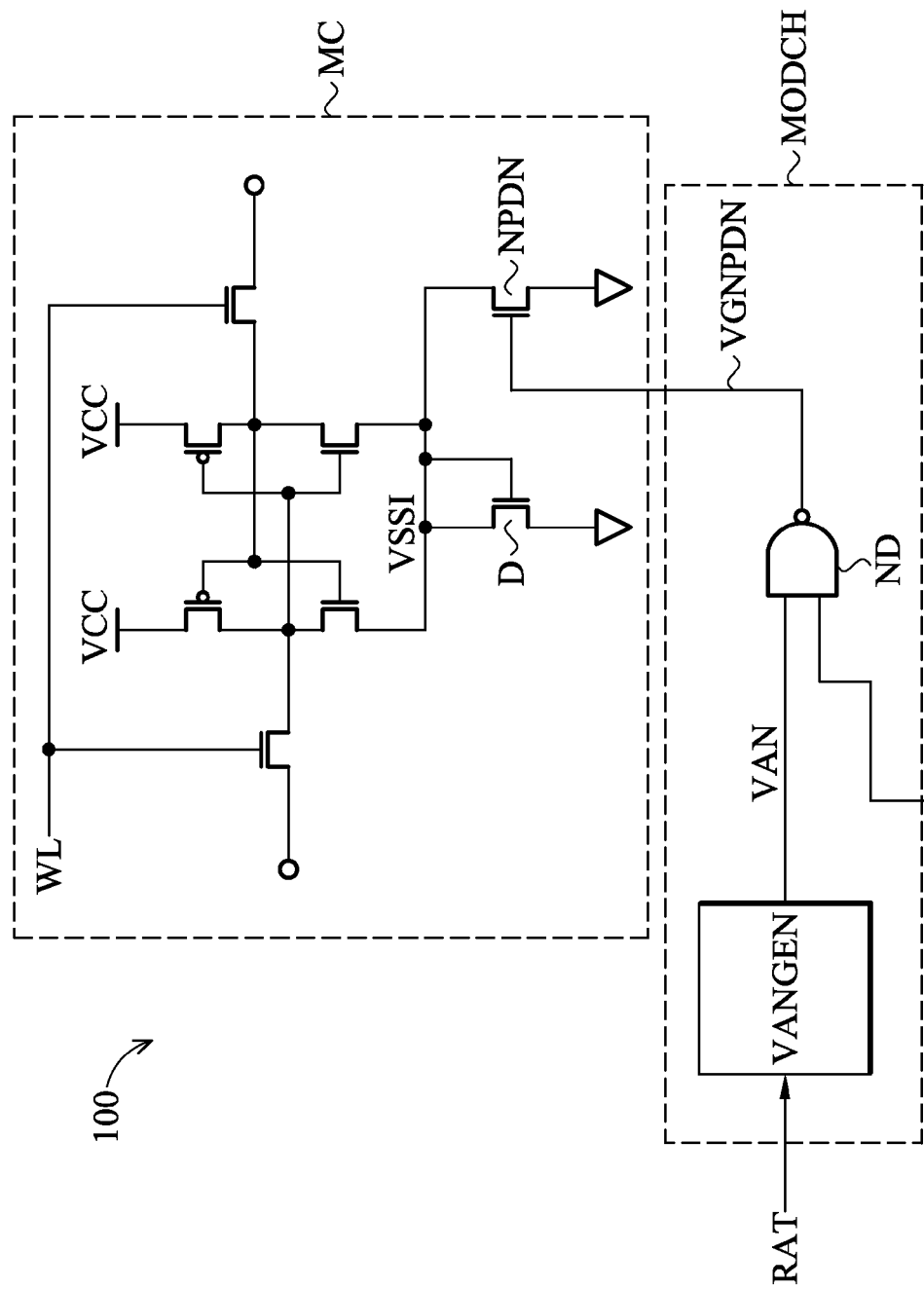
FIG. 1 is a diagram of an illustrative circuit in which a memory cell is used, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following advantages and/or features. The minimum operational voltage (VCCmin) in the power saving mode during standby is not compromised while the memory cell leakage current is reduced. The memory switches automatically between the power saving and the normal mode during standby in response to voltage and/or temperature variations.

Exemplary Circuit

FIG. 1 is a diagram of an illustrative circuit 100 in which a memory cell MC is used, in accordance with some embodiments. In some embodiments, a standby mode refers to a condition when there is no reading from or writing to memory cell MC. Current leakage in memory cell MC, however, continues to occur in the standby mode. Further, when the transistors are fast, and/or operate at high operational voltages VCC and/or high temperatures, the leakage current is high. As a result, circuit 100 is configured such that the leakage current is reduced to save power consumption. In other words, memory cell MC is configured to enter the power saving mode during standby (the "power saving mode"). In contrast, when the transistors are slow, and/or operate at lower operational voltages, and/or lower temperature, leakage current is low (e.g., exponentially reduced), memory cell MC is configured to stay at the normal mode during standby (the "normal mode"). Further, switching between the power saving mode and the normal mode is automatic. In some embodiments, the nominal voltage for voltage VCC is 0.85 V, the high voltage VCC is about 1.2 V, and the low voltage VCC is about 0.6 V.

Memory cell MC illustratively shown in FIG. 1 is commonly known in the art, and the details of memory cell MC are not labeled or described. Node VSSI serves as a reference ground level for memory cell MC. In some embodiments, when memory cell MC is in the normal mode, node VSSI is at a normal low voltage level (e.g., Low or 0 V). But if memory cell MC is in a power saving mode, node VSSI is raised by a voltage level, e.g., voltage VD (not labeled) of about 200 mV, which is the voltage drop across diode D. Diode D is formed by a transistor, e.g., transistor ND, not labeled, having the gate coupled to the drain.

Memory cell MC operates in a normal mode or in a power saving mode depends on the conduction state of transistor NPDN, i.e., whether transistor NPDN is on or off. For example, when transistor NPDN is on, node VSSI or the drain of transistor NPDN is pulled to the voltage level at the source of transistor NPDN (e.g., voltage VSS, not labeled), which is ground or a normal low level. In contrast, when transistor NPDN is off, transistor NPDN acts as an open circuit. As a result, node VSSI is at voltage VD, which is about 200 mV, in some embodiments. Effectively, node VSSI is raised by voltage VD. In some embodiments, a memory cell MC is configured to enter a power saving mode at different voltage VCC, depending on the transistor driving capabilities, i.e., depending on whether NMOS transistors and PMOS transistors in memory cell MC and related circuits are fast and/or slow. For example, in some embodiments, memory cell MC enters the power saving mode at about 0.7 V for FF transistors and enters the power saving mode at about 1.0 V for SS transistors. In circuit 100, node VSSI is raised for illustration, various embodiments are applicable when node VSSI is lowered.

Mode-changing circuit MODCH generates voltage VGN-PDN, the voltage at the gate of transistor NPDN, to turn on and off transistor NPDN. For example, when voltage VGN-PDN is Low, transistor NPDN is turned off, and node VSSI is raised. But when voltage VGNPDN is High, transistor NPDN is turned on, and node VSSI is at the normal low level. In other words, memory cell MC is in the normal mode or the power saving mode depends on the voltage level of voltage VGN-PDN. For example, if voltage VGNPDN is higher than the threshold voltage of transistor NPDN, memory cell MC is in the normal mode because transistor NPDN is on. But when voltage VGNPDN is lower than the threshold voltage of transistor NPDN, memory cell MC is in the power saving mode because transistor NPDN is off. In some embodiments, when voltage VCC and/or temperature changes, voltage VGNPDN changes and causes transistor NPDN to switch automatically between the on/off states. As a result, memory cell MC switches automatically between the normal and the power saving mode.

NAND gate ND is used to generate the logic level for voltage VGNPDN, based on signal VAN and signal ACTB, and serves as an enable circuit to enable the power saving mode for memory cell MC. In some embodiments, when signal ACTB is driven Low, memory cell MC is in the active mode and also the normal mode because node VSSI is not raised. Because signal ACTB is Low, voltage VGNPDN, through the operation of NAND gate ND, is High, regardless of the voltage level of signal VAN. As a result, transistor NPDN is on and pulls node VSSI to ground at the source of transistor NPDN. When signal ACTB is driven High, memory cell MC is the standby mode. Memory cell MC, however, is potentially in a power saving mode or remains at the normal power mode during standby. For example, when signal ACTB is High, memory cell MC is in the power saving mode when signal VAN is High because signal VGNPDN is Low and transistor NPDN is off. In contrast, when signal VAN is Low, memory cell MC is in the normal mode because signal VGN-PDN is High and transistor NPDN is on. In other words, whether memory cell MC is in the power saving mode depends on the logic level of signal VAN. When signal VAN is High signal VGNPDN, through the operation of NAND gate ND, is Low. In contrast, when signal VAN is Low, signal VGNPDN, through operation of NAND gate ND, is High.

Circuit VANGEN is used to generate signal VAN, which, in some embodiments, is based on a ratio RAT. Generating signal VAN, in effect, generates signal VGNPDN, because, when signal ACTB is High, signal VGNPDN is the inverse of signal VAN, which in turns controls whether memory cell MC enters the power saving mode or stays in the normal mode. In some embodiments, when signal ACTB is High, signal VAN and thus signal VGNPDN is generated to control transistor NPDN such that memory cell MC enters the power saving mode in some specific operational voltage VCC, depending on the current driving capabilities of the PMOS and NMOS transistors in circuit 100. For example, in some embodiments, memory cell MC is configured to enter the power saving mode at higher voltages VCC for the SS corner, and enter the power saving mode at lower voltages VCC for the FF corner.

Circuit VANGEN

Figure 2:
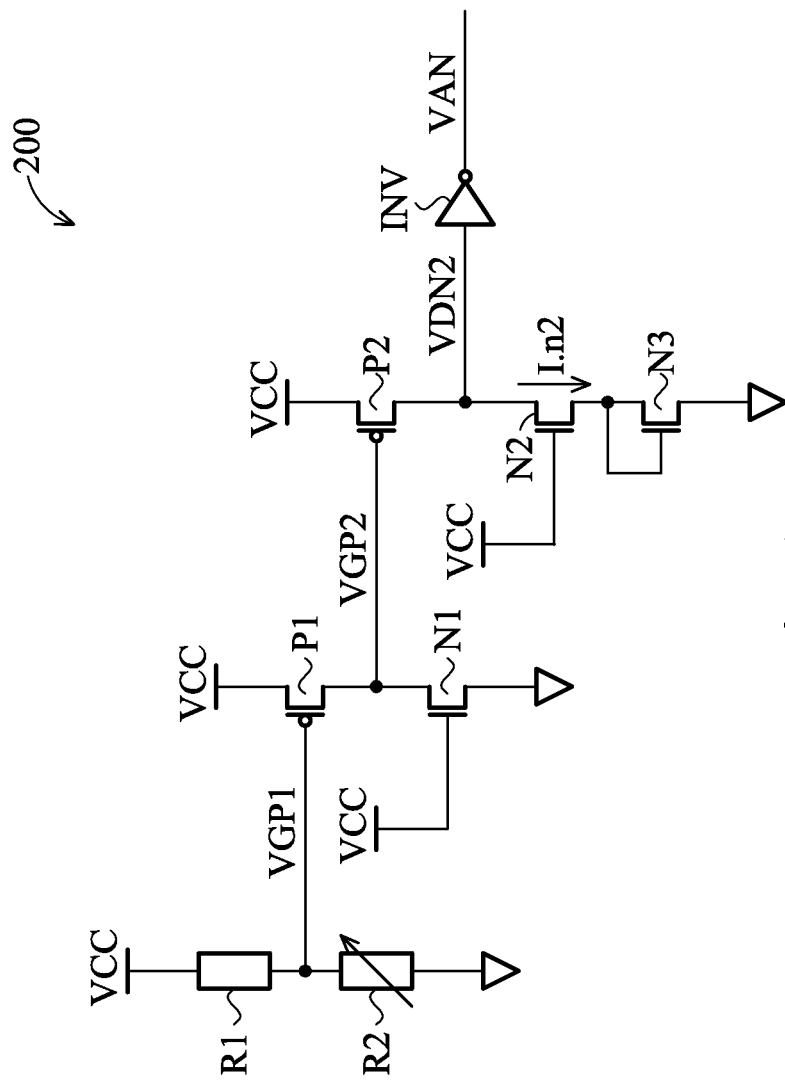
FIG. 2 is a detailed diagram of the VANGEN circuit of the circuit in FIG. 1, in accordance with some embodiments.

FIG. 2 is a detailed diagram of circuit VANGEN that generates signal VAN, in accordance with some embodiments.

Resistors R1 and R2 function as a voltage divider to generate ratio RAT that generates voltage VGP1 based on voltage VCC. Voltage VGP1 is the voltage at the gate of transistor P1. In some embodiments, VGP1=RAT*VCC and RAT is 0.3 or 30%. As a result, voltage VGP1 is 0.3 VCC, and voltage VGSP1, the voltage between the gate and the source of transistor P1, is 0.7 VCC. Those of ordinary skill in the art will recognize that if VGSP1 is greater than the threshold voltage, e.g., voltage VTP1, of transistor P1, then transistor P1 is on. But if voltage VGSP1 is less than voltage VTP1, then transistor P1 is off. Because the gate of transistor P1 is connected to resistors R1 and R2, changing ratio RAT changes voltage VGP1, which in turn changes voltage VGSP1. As a result, transistor P1 can be controlled (e.g., turned on/off) based on ratio RAT.

Resistor R2 is an adjustable resistor adjusted to achieve a predetermined ratio RAT. In some embodiments, simulation is performed to set ratio RAT based on the switching of voltage VAN (e.g., based on the transition from a Low to a High or from a High to a Low) because the time at which voltage VAN switches indicates the time memory cell MC changes between the normal mode and the power saving mode. For example, circuit 200 is set to operate at a particular operational voltage VCC, e.g., nominal voltage VCC and temperature, e.g., room temperature. The time at which voltage VAN switches is observed. One or a combination of resistor R1 and R2 is adjusted, which, in effect, adjusts ratio RAT. When signal VAN switching occurs at the pre-determined time, the values of resistors R1 and R2 (and thus ratio RAT) are recorded, i.e., selected. In some embodiments, the above steps to determine ratio RAT are performed at different operational voltage VCC and/or temperatures. In some embodiments, because of process variations, two circuits 100 (e.g., two dice) in two manufacturing lots (e.g., two different wafers) may have two different levels for voltage VAN, different ratios RATs are set to adjust for the different VAN voltage levels for different transistor driving capabilities in different wafers. As a result, memory cell MC enters the power saving mode at different voltage VCC levels based on predetermined results. Resistors R1 and R2 are shown for illustration, other configurations and mechanisms that provide a voltage VGP1 in relation to voltage VCC are within the scope of various embodiments.

Transistor P1 and transistor N1 are coupled in series, i.e., the drain of P1 transistor is coupled to the drain of transistor N1, and are used to provide voltage VGP2, which in turns is used to turn on/off transistor P2. For example, if transistor P1 is off, voltage VGPN2 is pulled to the source of transistor N1, which is ground or Low. As a result, transistor P2 is turned on. In contrast, when transistor P1 is on and is conducting stronger than transistor N1, voltage VGP2 is pulled towards the source of transistor P1, which is VCC or High. As a result, transistor P2 is turned off.

Whether voltage VGP2 is pulled up to voltage VCC of transistor P1 or pulled down to ground of transistor N1 depends on voltage VGP1 or voltage VGSP1 with respect to threshold voltage VTP1. For example, when voltage VGSP1 is much higher than voltage VTP1, transistor P1 is in a strong conduction state, and voltage VGP2 is pulled up to voltage VCC (i.e., pulled up to a High). But when voltage VGSP1 is closer to threshold voltage VTP1, transistor P1 is not in a strong conduction state (i.e., transistor P1 is weak), transistor N1 tends to pull down voltage VGP2 to ground or a Low. In brief, voltage VGP2 is more likely to be High when VGSP1 is higher than threshold voltage VTP1 and is more likely to be Low when VGSP1 is closer to or is below threshold voltage VTP1. Because voltage VGSP1 is directly proportional to voltage VCC, voltage VGP2 is more likely to be High when voltage VCC increases (i.e., is in the higher value range) and is more likely to be Low when voltage VCC decreases (i.e., is in the lower value range). Because memory cell MC enters the power saving mode when voltage VGP2 is High and remains in the normal mode when voltage VGP2 is Low, memory cell MC enters the power saving mode when voltage VCC is at higher values and remains in the normal state when voltage VCC is at lower values.

In some embodiments, whether memory cell MC enters the power saving mode at a higher or lower voltage VCC also depends on the driving capabilities of both NMOS transistor N1 and PMOS transistor P1, i.e., depends on whether transistor N1 and/or P1 is fast or slow. For example, when NMOS transistor N1 is fast, the threshold voltage of NMOS transistor N1 is lowered, transistor N1 is turned on easier with a lower voltage VCC because the gate of transistor N1 is tied to voltage VCC. As a result, voltage VGP2 is pulled Low easier at lower voltage VCC. Consequently, voltage VAN is Low easier at low voltage VCC, or voltage GNPDN is High easier at low voltage VCC, or transistor NPDN is on easier at low voltage VCC. As a result, memory cell MC tends to remain at the normal mode at low voltage VCC and tends to enter the power saving mode at higher voltage VCC. Explained in a different way, if NMOS transistor N1 is fast and/or transistor P1 is slow, transistor P1 takes higher voltage VCC to pull node VGP2 to a High. As a result, memory cell MC enters the power saving mode at higher voltage VCC. Explained in yet another way, if PMOS transistor P1 is fast, voltage VGP2 is more likely to be High at lower voltage VCC, and, as a result, memory cell MC tends to enter the power saving mode at lower voltage VCC.

In some embodiments, transistor N1 and/or transistor P1 are configured such that when both transistors N1 and P1 are on, transistor N1 has less driving capability than that of transistor P1 so that voltage VGP2 is pulled towards voltage VCC at the source of transistor P, i.e., pulled up to a High, instead of being pulled towards ground or Low at the source of transistor N1. As a result, at a selected ratio RAT (e.g., a default ratio RAT), when voltage VCC is about 110% of normal voltage VCC, at all driving capabilities of NMOS and PMOS transistors (all FF, SS, SF and FS corners), voltage VGP2 is set to be pulled up to 80% of normal voltage VCC, and the sizes of transistors N1 and P1 are adjusted accordingly. Stated differently, because transistor N1 is not conducting as strong as transistor P1, current IDSsat of transistor N1 is designed smaller than that of transistor P1. In some embodiments, reducing the width and/or increasing the channel length of transistor N1 results in a weaker transistor N1, i.e., a transistor N1 having a smaller current IDSsat. Similarly, increasing the width and/or decreasing the length of transistor P1 results in a stronger transistor P1, i.e., a transistor P1 having a higher current IDSsat. When transistor P1 is stronger than transistor N1, and both transistors N1 and P1 are on, voltage VGP2 is pulled up to voltage VCC at the source of transistor P1, instead of being pulled down to ground or Low at the source of transistor N1. In some embodiments, the driving capability of transistor N1 is about 1/10 of that of transistor P1. In some embodiments, the relative strength (i.e., the relative driving capability) between transistor N1 and transistor P1 is set by simulation based on the switching of voltage VGNPDN.

Transistor P2 together with transistor N2 and transistor N3 formed as a diode provides the logic level for voltage VDN2, which is inverted by inverter INV, to provide the logic level for voltage VAN. For example, when transistor P2 is on, voltage VDN2 is pulled to the voltage level at the source of transistor P2, which is VCC or High. In contrast, when transistor P2 is off, voltage VDN2 is pulled toward the source of transistor N3, which is Low. As a result, voltage VAN, through inverter INV, is High. The logic level of voltage VAN (e.g., Low or High) is used to switch transistor NPDN, and thus controls whether memory cell MC enters the power saving mode as explained above. In some embodiments, when NMOS transistors N2 and N3 are fast, the threshold voltage of transistor N2 and N3 are lowered. Voltage VDN2 is pulled down to a Low at lower voltage VCC or voltage VAN is High and voltage VGNPDN is Low at lower voltage VCC. As a result, memory cell MC enters the power saving mode easier (e.g., at low voltage VCC). In some embodiments, diode N3 is not used, i.e., the source of transistor N2 is directly coupled to ground.

In some embodiments, when transistor P1 is on, voltage VGP2 is pulled to voltage VCC at the source of transistor P1. If, however, voltage VGP2 is at a level such that transistor P2 is conducting weakly, e.g., transistor P2 is about the level to be on, current I.n2 increases because of higher voltage VCC. As a result, voltage VDN2 is lower and when VDN2 turns to a Low, e.g., voltage VDN2 passes the trip point of inverter INV, memory cell MC then enters the power saving mode. In some embodiments, N-type transistors N1, N2, and N3 in circuit 200 are in the same driving capability corners (e.g., fast or slow) as those of N-type transistors in memory cell MC. Similarly P-type transistors P1 and P2 in circuit 200 are in the same driving capability corners as those of P-type transistors in memory cell MC.

In some embodiments, when the operational temperature changes, the threshold voltage of both PMOS and NMOS transistors changes, which affects the voltage VCC at which memory cell MC enters the power saving mode. For example, when the temperature is high, the threshold voltage of both transistors N1 and P1 is lowered, and when the temperature is low, the threshold voltage of both transistors N1 and P1 is higher, which affects the voltage VCC at which memory MC enters the power saving mode as explained above. As a result, if signal ACTB is activated, memory cell MC in response to the temperature changes, switches automatically between the power saving and the normal mode.

Example for High Voltage VCC Operation

In some embodiments, the nominal voltage VCC is 0.85V. When voltage VCC is high, e.g., about 1.2 V, voltage VGSP1 is about 0.84 V, which is much higher than threshold voltage VTP1, which is about 300-450 mV. As a result, transistor P1 is in the strong conduction state. At the same time, voltage VGPN1, the voltage at the gate of transistor N1 (not labeled) is at voltage VCC (i.e., 1.2 V), transistor N1 is also on. In some embodiments, however, transistor N1 is designed such that transistor N1 is not conducting as strong as transistor P1. As a result, voltage VGP2 is pulled up to voltage VCC at the source of transistor P1, instead of being pulled down to ground at the source of transistor N1. Consequently, transistor P2 is off, acting as an open circuit. Because the gate of transistor N2 is coupled to voltage VCC, transistor N2 is on. Transistor N3 functions as a diode. Transistor N2 being on, together with diode N3, pulls node VDN2 towards the source of transistor N3, which is about 200 mV. As a result, voltage VDN2 is Low, voltage VAN is High, voltage VGNPDN is Low, setting memory cell MC in the power saving mode.

Example for Low Voltage VCC Operation

When voltage VCC is low, e.g., about 0.7 V, VGSP1 is about 0.49 V (0.7*0.7 V), transistor P1 is almost off because VGSP1 is closer to voltage VTP1. At the same time, voltage VGSN1 is still at about 0.7 V (e.g., at the VCC voltage level), which is much higher than threshold voltage VTN1 of about 300-450 mV. As a result, transistor N1 is in the strong conduction state, which pulls voltage VGP2 to ground. Transistor P2 is consequently on, voltage VDN2 is High, voltage VAN is Low, voltage VGNPDN is High, transistor NPDN is on, and memory cell MC is in the normal mode.

Illustrative Waveforms

Figure 3:
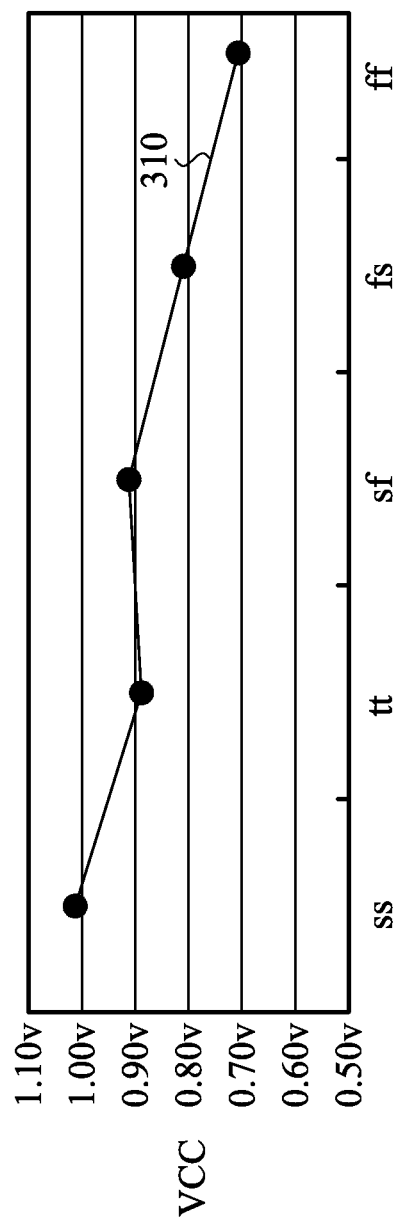
FIG. 3 is a graph of waveforms illustrating the different levels of operational voltage of the memory cell in FIG. 1 at which the memory cell enters the power saving mode, in accordance with some embodiments.

FIG. 3 is a graph of waveforms illustrating the different voltage levels of voltage VCC at which memory MC enters the power saving mode with reference to different transistor driving capabilities, in accordance with some embodiments.

The vertical axis shows the different levels of voltage VCC. The horizontal axis shows the different driving capabilities SS, TT, SF, FS, and FF at 125° C. As shown, at the same temperature of 125° C., memory cell MC enters the power saving mode at a lower voltage VCC of about 0.7 V for the FF corner, and enters the power saving mode at higher voltage VCC of about 1.0 V for the SS corner. At other corners, e.g., TT, SF, and FS, memory cell MC enters the power saving mode at about 0.89 V, 0.91 V, and 0.8 V, respectively, which are all below the high VCC of 1.0 V and higher than the low VCC of 0.7 V.

In some embodiments, when the temperature is lowered, curve 310 is higher with respect to the vertical axis, indicating memory cell MC entering the standby mode at higher voltage VCC. In contrast, when the temperature increases, curve 310 is lower with respect to the vertical axis, indicating memory cell MC entering the standby mode at lower voltage VCC.

Exemplary Method

Figure 4:
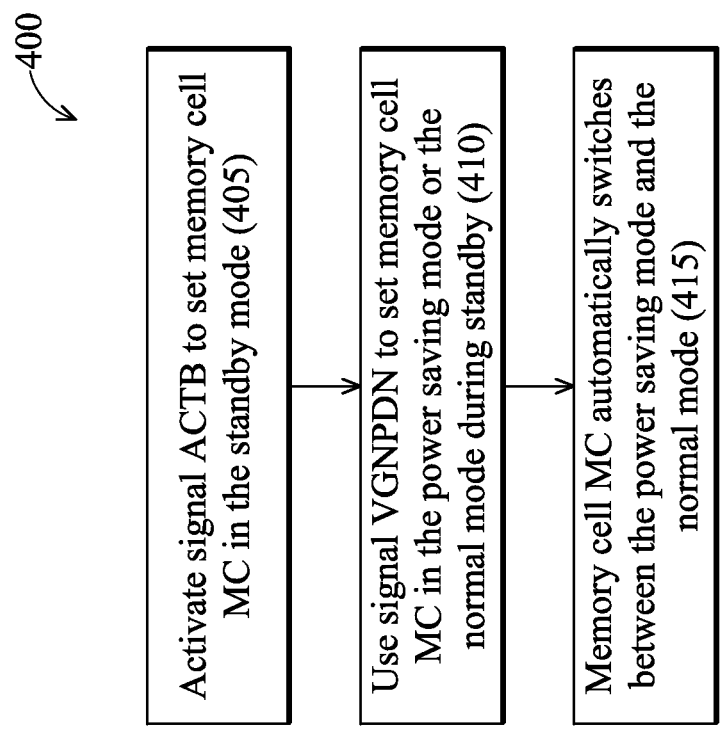
FIG. 4 is a flowchart illustrating an operation of the circuit in FIG. 1.

FIG. 4 is a flowchart 400 illustrating a method for operating circuit 100, in accordance with some embodiments.

In step 405, signal ACTB is activated for memory cell MC to enter the standby mode.

In step 410, whether memory cell MC is in the power saving or normal mode during the standby mode depends on the logic state of voltage VGNPDN that dictates the conduction state of transistor NPDN.

In step 415, as voltage VCC and/or temperature changes that causes a change in voltages VGP1, VGP2, VDP2, VAN, and VGNPDN, memory cell MC automatically switches between the power saving mode and the normal mode.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, selecting different dopant types are within the scope of various embodiments. The logic level (e.g., low or high) of the various signals used in the above description is also for illustration purposes, embodiments are not limited to a particular level when a signal is activated and/or deactivated. Selecting the different levels is within the scope of various embodiments. Node VSSI is raised in the power saving mode and is used for illustration, various embodiments of the disclosure are applicable when node VSSI is lowered. Transistor NPDN is shown part of memory cell MC, but, in some embodiments, transistor NPDN is outside of memory MC and/or part of mode changing circuit MODCH. Memory cell MC is illustrated as an SRAM, but various embodiments are not so limited, i.e., the various embodiments are applicable to other types of memory.

FIG. 2 shows the resistor circuit (e.g., the R1, R2 circuit) using discrete resistors for illustration only, equivalent circuitry may be used. For example, a resistive device, circuitry or network (e.g., a combination of resistors, resistive devices, circuitry, etc.) can be used in place of the resistor.

In some embodiments, a circuit includes a PMOS transistor having a PMOS drain, a PMOS source, and a PMOS gate, an NMOS transistor having an NMOS drain, an NMOS source, and an NMOS gate, and a logic level generation section comprising an input and a logic level output. The PMOS gate is configured to receive an input voltage having a voltage level determined based on an operational voltage, the PMOS drain is coupled to the NMOS drain and the input of the logic level generation section, and the PMOS source is coupled to the operational voltage. The NMOS gate is configured to receive a voltage that causes the NMOS transistor to have a first driving capability. The first driving capability of the NMOS transistor is less than that of the PMOS transistor if the input voltage has a voltage level greater than a predetermined voltage level.

In some embodiments, a method comprises receiving, by a circuit, an input voltage having a voltage level determined based on an operating voltage of the circuit and determining a logic level based on a first transistor having a driving capability lower than a driving capability of a second transistor if the input voltage has a voltage level greater than a predetermined voltage level. The method further comprises outputting an output signal having the logic level.

In some embodiments, a method comprises adjusting a driving capability of a first transistor of a circuit based on a voltage level of a first signal and generating a control signal by the circuit based on the driving capability of the first transistor. The method further comprises adjusting a conduction state of a second transistor to cause a voltage level at a node to switch between a first state of the node and a second state of the node responsive to the conduction state of the second transistor.

The above methods show exemplary steps, but they are not necessarily performed in the order shown. Steps may be added, replaced, changed order, and/or eliminated as appropriate, in accordance with the spirit and scope of disclosed embodiments.

What is claimed is:
1. A circuit comprising:
a PMOS transistor having a PMOS drain, a PMOS source, and a PMOS gate;
an NMOS transistor having an NMOS drain, an NMOS source, and an NMOS gate; and
a logic level generation section comprising an input and a logic level output;
wherein
the PMOS gate is configured to receive an input voltage having a voltage level determined based on an operational voltage;
the PMOS drain is coupled to the NMOS drain and the input of the logic level generation section;
the PMOS source is coupled to the operational voltage;

the NMOS gate is configured to receive a voltage that causes the NMOS transistor to have a first driving capability; and the first driving capability of the NMOS transistor is less than that of the PMOS transistor if the input voltage has a voltage level greater than a predetermined voltage level.

2. The circuit of claim 1, further comprising a voltage divider configured to generate the input voltage level based on the operational voltage.

3. The circuit of claim 2, wherein the voltage divider comprises an adjustable resistor.

4. The circuit of claim 1, wherein a potential driving capability of the NMOS transistor is less than a potential driving capability of the PMOS transistor.

5. The circuit of claim 4, wherein the potential driving capability of the NMOS transistor is about one tenth of the potential driving capability of the PMOS transistor.

6. The circuit of claim 1, wherein the logic level generation circuit comprises an inverter, the inverter comprising an output configured as the logic level output of the logic level generation circuit.

7. The circuit of claim 1, further comprising an enable circuit configured to electrically receive an output signal at the logic level output and an input enable signal and generate an output enable signal configured to change a mode of a memory cell.

8. The circuit of claim 1, wherein the NMOS gate is configured to receive the operational voltage.

9. A method comprising:
receiving, by a circuit, an input voltage having a voltage level determined based on an operating voltage of the circuit;
determining a logic level based on a first transistor having a driving capability lower than a driving capability of a second transistor if the input voltage has a voltage level greater than a predetermined voltage level; and
outputting an output signal having the logic level.

10. The method of claim 9, further comprising generating the input voltage level from the operating voltage with a voltage divider.

11. The method of claim 10, wherein the input voltage level is based on an adjustment to an adjustable resistor in the voltage divider.

12. The method of claim 11, wherein the adjustment to the adjustable resistor achieves a predetermined ratio of the voltage divider.

13. The method of claim 9, further comprising receiving the input voltage at a gate of the second transistor.

14. The method of claim 1, further comprising:
receiving the output signal at a first input of an enable circuit;
receiving an enable signal at a second input of the enable circuit; and
changing a mode of a memory cell based on an enable circuit output signal.

15. A method comprising:
adjusting a driving capability of a first transistor of a circuit based on a voltage level of a first signal;
generating a control signal by the circuit based on the driving capability of the first transistor; and
adjusting a conduction state of a second transistor to cause a voltage level at a node to switch between a first state of the node and a second state of the node responsive to the conduction state of the second transistor.

16. The method of claim 15, wherein the second transistor is an NMOS transistor having a drain coupled to the node.

17. The method of claim 15, wherein the generating a control signal comprises performing a NAND operation based on an enabling signal and a second signal indicating the driving capability of the first transistor.

18. The method of claim 15 wherein the second transistor is coupled to the node configured as a ground reference node of a memory cell.

19. The method of claim 15, wherein the generating a control signal comprises comparing the driving capability of the first transistor and a driving capability of a third transistor of the circuit.

20. The method of claim 15, further comprising inputting the first signal at a gate of the first transistor based on an operational voltage of the circuit.

* * * * *